United States Patent [19]
Okada et al.

[11] Patent Number: 5,859,444
[45] Date of Patent: Jan. 12, 1999

[54] SEMICONDUCTOR DEVICE

[75] Inventors: Teruhiko Okada; Hirotada Kuriyama; Yoshio Kohno, all of Hyogo, Japan

[73] Assignee: Mitsubishi Denki Kabushiki Kaisha, Tokyo, Japan

[21] Appl. No.: 795,207

[22] Filed: Feb. 5, 1997

Related U.S. Application Data

[63] Continuation of Ser. No. 429,443, Apr. 27, 1995, abandoned, which is a continuation-in-part of Ser. No. 152,784, Nov. 16, 1993, abandoned, which is a continuation of Ser. No. 925,157, Aug. 6, 1992, abandoned.

[30] Foreign Application Priority Data

Aug. 8, 1991 [JP] Japan .................................. 3-199434

[51] Int. Cl.$^6$ .......................... H01L 29/76; H01L 31/036; H01L 31/112; H01L 27/01
[52] U.S. Cl. ............................... 257/66; 257/67; 257/347
[58] Field of Search ................................ 257/66, 67, 347

[56] References Cited

FOREIGN PATENT DOCUMENTS

| | | |
|---|---|---|
| 2503864 | 8/1976 | Germany . |
| 3533032 | 3/1987 | Germany . |
| 55-132072 | 10/1980 | Japan . |
| 56-88354 | 7/1981 | Japan . |
| 57-132365 | 8/1982 | Japan . |
| 58-124261 | 7/1983 | Japan . |
| 58-201364 | 11/1983 | Japan . |
| 5218169 | 12/1983 | Japan . |
| 58-218169 | 12/1983 | Japan . |
| 59-108360 | 6/1984 | Japan . |
| 59-111368 | 6/1984 | Japan . |
| 61-173286 | 8/1986 | Japan . |
| 62-190761 | 8/1987 | Japan . |
| 63-104373 | 5/1988 | Japan . |
| 1229229 | 9/1989 | Japan . |
| 1-268064 | 10/1989 | Japan . |
| 1276672 | 11/1989 | Japan . |
| 2-2175 | 1/1990 | Japan . |
| 2-312271 | 12/1990 | Japan . |
| 341774 | 2/1991 | Japan . |
| 3048463 | 3/1991 | Japan . |
| 3293773 | 12/1991 | Japan . |
| 41-62668 | 6/1992 | Japan . |
| WO92/06490 | 4/1992 | WIPO . |

OTHER PUBLICATIONS

International Electron Devices Meeting, 1990, San Francisco, California, Dec. 9–12. 1990 pp. 18.3.1–18.3.4.

"256 kbit CMOS EPROM HN27C256", Hideaki Takahashi et al., 8297 Hitachi Review, vol. 34, No. 6, Dec., 1985, pp. 295–298.

"A 5.9um$^2$ Super Low Power SRAM Cell Using a New Phase–Shift Lithography" T. Yamanaka et al., IEDM 1990, pp. 477–480.

"A Large Cell–Ratio and Low Node Leak 16M–bit SRAM Cell Using Ratio–Gate Transistors", K. Yuzuriha et al., IEDM 1991, pp. 485–488.

T. Yamanaka et al., "A 5.9 $\mu$m$^2$ Super Low Power SRAM Cell Using a New Phase–Shift Lithography," International Electron Devices Meeting, San Francisco, CA, Dec. 9–12, 1990, Dec. 9, 1990, No. 90, Institute of Electrical and Electronics Engineers, pp. 477–480.

Manabu Ando et al., "A 0.1–$\mu$ A Standby Current, Ground–Bounce–Immune 1 Mbit CMOS SRAM," IEEE Journal of Solid–State Circuits, vol. 24, No. 6, Dec. 1, 1989, pp. 1708–1712.

T. Yamanaka et al., "A 25 $\mu$m$^2$, New Poly–Si PMOS Load (PPL) SRAM Cell Having Excellent Soft Error Immnnity," Electron Devices, San Francisco, CA, Dec. 11–14, 1988, Institute of Electrical and Electronics Engineers, No. 1988, Dec. 11, 1988, pp. 48–51.

*Primary Examiner*—Stephen Meier
*Attorney, Agent, or Firm*—McDermott, Will & Emery

[57] ABSTRACT

A semiconductor device is an SRAM cell having a pair of access transistors, a pair of driver transistors and a pair of load transistors. A gate electrode of the load transistor is electrically connected to a region of a semiconductor substrate which is surrounded by a gate electrode of the driver transistor, a channel region of the load transistor is formed opposite to the gate electrode of the load transistor with an insulating film therebetween, and a pair of source/drain regions of the load transistor are formed to sandwich the channel region.

14 Claims, 21 Drawing Sheets

5,859,444

SEMICONDUCTOR DEVICE

RELATED APPLICATIONS

This application is a continuation of application Ser. No. 08/429,443 filed Apr. 27, 1995 now abandoned, which is a continuation-in-part of application Ser. No. 08/152,784 filed on Nov. 16, 1993 now abandoned, which is a continuation application of Ser. No. 07/925,157 filed on Aug. 2, 1992 now abandoned.

BACKGROUND OF THE INVENTION

1. Field of the Invention

The present invention relates to a semiconductor device, and more particularly, to a structure of a semiconductor device having a thin film transistor.

2. Description of the Background Art

In recent years, for meeting a demand for shrinking the size of a semiconductor-device, development on a thin film transistor (hereinafter referred to as TFT) to be formed as a field effect transistor by forming a semiconductor thin film on an insulator substrate and providing a channel in the semiconductor thin film has been under way.

A description of a structure of the TFT follows in conjunction with the accompanying drawings.

Referring to FIG. 48, a gate electrode 2 of polysilicon is formed on an interlayer insulating film 1 formed on a bulk transistor (not shown). A gate oxide film 6 is formed along the top flat portion and sidewalls of gate electrode 2. A semiconductor layer 7 is formed along gate oxide film 6. Formed at a position of semiconductor layer 7 opposite to gate electrode 2 is a channel region 7a. Source/drain regions 7b, 7c are formed at positions having channel region 7a therebetween.

A description of a manufacturing process of a TFT having the above-stated structure follows in conjunction with FIGS. 49–55.

Referring to FIG. 49, an interlayer insulating film 1 is formed as thick as 1500 nm on a bulk transistor (not shown) by thermal chemical vapor deposition. A polysilicon layer 2 to be the gate electrode 2 of the TFT is deposited as thick as 200 nm on interlayer insulating film 1 by means of thermal chemical vapor deposition.

Referring to FIG. 50, a resist film 4 having a prescribed form is formed on the surface of polysilicon layer 2 by a photolithography technique. Referring to FIG. 51, using resist film 4 as mask, polysilicon layer 2 is subjected to anisotropic reactive ion etching to form gate electrode 2.

Referring to FIG. 52, a resist film 4 is etched away. Referring to FIG. 53, an oxide film 6 for forming a gate oxide film having a thickness of 50 nm is formed on the surfaces of gate electrode 2 and interlayer insulating film 1 by thermal CVD. A polysilicon layer 7 to form the semiconductor layer of the TFT is deposited as thick as 50 nm on oxide film 6 by thermal chemical vapor deposition.

Referring to FIG. 54, a resist film 8 is formed on the surface of polysilicon layer 7. Resist film 8 is patterned into a prescribed form by means of a photolithography technique or the like. Using resist film 8 as mask, an impurity, for example, $1\times10^{15}$ (cm$^{-2}$) of boron for forming source/drain regions is implanted into polysilicon layer 7.

Referring to FIG. 55, resist film 8 is etched away. Thus formed is the TFT having channel region 7a in the region of polysilicon layer 7 opposite to the gate electrode 2 and source/drain regions 7b, 7c at the positions having channel region 7a therebetween.

The TFT having the structure described above, however, suffers from the following disadvantage. Referring to FIG. 55, gate electrode 2 is formed by subjecting the polysilicon layer to anisotropic reactive iron etching. Gate electrode 2 therefore takes a substantially rectangular form. Thus, with gate electrode 2 having a rectangular form, substantially orthogonal edges 9, 9 are produced in oxide film 6 and polysilicon layer 7 formed along gate electrode 2. Electric fields are likely to concentrate on these edges 9, 9 resulting in hot carriers or the like. The hot carriers enter into gate oxide film 6, thus deteriorating the insulation of gate oxide film 6.

SUMMARY OF THE INVENTION

It is an object of the present invention to provide a semiconductor device having a thin film transistor (TFT) with no orthogonal edge portions created in a gate oxide film and a semiconductor layer covering a gate electrode of the thin film transistor (TFT).

A semiconductor device according to the present invention which accomplishes the above-described object, in one aspect, is an SRAM cell having a pair of access transistors, a pair of driver transistors and a pair of load transistors on a semiconductor substrate, and includes an impurity region which is formed in a region surrounded by a gate electrode of the driver transistor in semiconductor substrate, and to which a gate electrode of the load transistor is electrically connected, a channel region of the load transistor formed in a position opposite to the gate electrode of the load transistor with an insulating film therebetween, and a pair of source/drain regions of the load transistor formed to sandwich the channel region.

According to this structure of the semiconductor device, no orthogonal bent is formed in the channel region and the source/drain regions formed above the gate electrode of the load transistor. Thus, the concentration of electric fields as generated in a structure of a conventional semiconductor device can be suppressed. Furthermore, hot carriers in the channel region can be prevented from being introduced into the insulating film.

Consequently, malfunction caused by a load transistor is reduced, resulting in a reliable semiconductor device having an SRAM cell.

A semiconductor-device according to the present invention which accomplishes the above-described object, in another aspect, is a semiconductor device provided with an SRAM cell having a pair of access transistors, a pair of driver transistors and a pair of load transistors on a semiconductor substrate, and includes a first impurity region formed at a region of the semiconductor substrate sandwiched between a gate electrode of one of the pair of access transistors and a gate electrode of one of the pair of driver transistors; a second impurity region formed at a region of the semiconductor substrate sandwiched between a gate electrode of the other access transistor and a gate electrode of the other driver transistor; a gate electrode of the load transistor connected to the second impurity region; a channel region of the load transistor formed opposite to the gate electrode of the load transistor with an insulating film therebetween; and a pair of source/drain regions of the load transistor formed to sandwich the channel region, wherein one of the pair of source/drain regions of the load transistor is connected to the first impurity region.

According to this structure of the semiconductor device, since the source/drain region of the load transistor is connected to the impurity region formed between the gate electrode of the access transistor and the gate electrode of the driver transistor, no orthogonal bent is formed in the source/drain regions such as formed in the structure of the conventional semiconductor device. Thus, the concentration of electric fields in the channel region as generated in the structure of the conventional semiconductor device can be prevented.

Consequently, a reliable semiconductor device having an SRAM cell, which is free from malfunction caused by a load transistor, can be provided.

A semiconductor device according to the present invention which accomplishes the above-described object, in a further aspect, includes a semiconductor substrate; a pair of impurity regions of an access transistor formed at prescribed regions of a main surface of the semiconductor substrate; a pair of impurity regions of a driver transistor formed at prescribed regions of the main surface of the semiconductor substrate; a gate electrode of the driver transistor formed on the main surface of the semiconductor substrate with a gate oxide film therebetween so as to have a contact hole which exposes a surface of one of the pair of impurity regions of the driver transistor and to have a portion thereof connected to one of the pair of impurity regions of the access transistor; a gate electrode of a load transistor formed to be connected to one of the pair of impurity regions of the driver transistor in the contact hole and to extend over the gate electrode of the driver transistor with a first interlayer insulating film therebetween; and a conductive layer formed above the gate electrodes of the driver transistor and the load transistor with a second interlayer insulating film therebetween, and having a channel region formed opposite to the gate electrode of the load transistor and a pair of impurity regions of the load transistor formed to sandwich the channel region; wherein one of the pair of impurity regions of the load transistor and the gate electrode of the driver transistor are connected to one of the pair of impurity regions of the access transistor.

According to this structure of the semiconductor device of the present invention, no orthogonal bent is formed in the channel region and the pair of impurity regions of the conductive layer formed above the gate electrode of the load transistor. Thus, the concentration of electric fields in the channel region as generated in the structure of the conventional semiconductor device can be suppressed. Furthermore, introduction of hot carriers in the channel region into the second interlayer insulating film can be prevented. Consequently, malfunction caused by the load transistor is eliminated, resulting in a reliable semiconductor device.

A semiconductor device of the present invention which accomplishes the above-described object, in a still further aspect, includes a semiconductor substrate; a gate electrode of a first access transistor and a gate electrode of a first driver transistor as well as a gate electrode of a second access transistor and a gate electrode of a second driver transistor formed on a main surface of the semiconductor substrate at a prescribed distance away from each other with a gate oxide film therebetween; a first impurity region formed at the main surface of the semiconductor substrate to be sandwiched between the gate electrode of the first access transistor and the gate electrode of the first driver transistor; a second impurity region formed at the main surface of the semiconductor substrate to be sandwiched between the gate electrode of the second access transistor and the gate electrode of the second driver transistor; a first conductive layer electrically connected to the first impurity region and formed above the gate electrode of the first access transistor and the gate electrode of the first driver transistor with a first interlayer insulating film therebetween; a gate electrode of a load transistor formed above the second impurity region with the first interlayer insulating film therebetween to extend over the gate electrode of the second access transistor and the gate electrode of the second driver transistor; and a second conductive layer formed above the gate electrode of the load transistor with a second interlayer insulating film therebetween, and having a channel region of the load transistor formed opposite to the gate electrode of the load transistor and a pair of impurity regions of the load transistor formed to sandwich the channel region; wherein one of the pair of impurity regions of the load transistor is electrically connected to the first conductive layer.

According to this structure of the semiconductor device of the present invention, since the first impurity region formed between the gate electrodes of the first access transistor and the first driver transistor is electrically connected to one of the pair of impurity regions of the load transistor, no orthogonal bent as formed in the structure of the conventional semiconductor device is formed. Thus, the concentration of electric fields in the channel region as generated in the structure of the conventional semiconductor device can be suppressed.

Consequently, a reliable semiconductor device which is free from malfunction caused by the load transistor can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description of embodiments of a thin film transistor (TFT) in accordance with the present invention follows in conjunction with the accompanying drawings.

Figure 1:
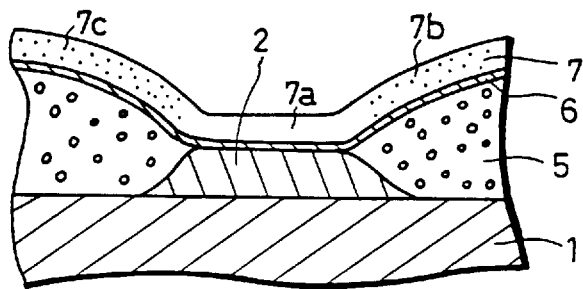
FIG. 1 is a cross sectional view showing a structure of a thin film transistor in accordance with a first embodiment of the present invention.

A structure of a TFT in accordance with the first embodiment of the present invention will be described in conjunction with FIG. 1.

The TFT according to the first embodiment has an interlayer insulating film 1 formed on a bulk transistor (not shown). A gate electrode 2 having a central flat portion and inclined sidewalls descending rightward and leftward from the right and left ends of the central flat portion is formed on interlayer insulating film 1. First insulating layers 5, 5 are formed in contact with and along the right and left ends of the central flat portion of the gate electrode and the inclined sidewalls.

A gate oxide film 6 which is a second insulating layer is formed on the surfaces of gate electrode 2 and first insulating layers 5, 5. A semiconductor layer 7 of first type conductivity, for example, p type is formed on the surface of gate oxide film 6. A P type channel region 7a is formed on the p type semiconductor layer at the position opposing the central flat portion. Source/drain regions 7b, 7c of second type conductivity, for example, n type is formed at the positions of p type semiconductor layer 2 having channel region 7a therebetween.

A description of a manufacturing process of a TFT having the above-states structure follows.

Figure 2:
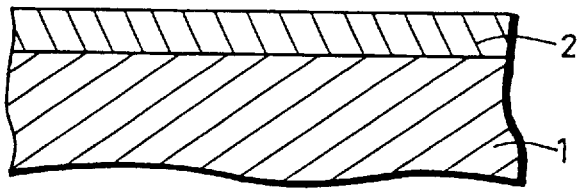
FIGS. 2 to 10 are cross sectional views showing a manufacturing process of the thin film transistor in accordance with the first embodiment of the present invention.
Figure 3:
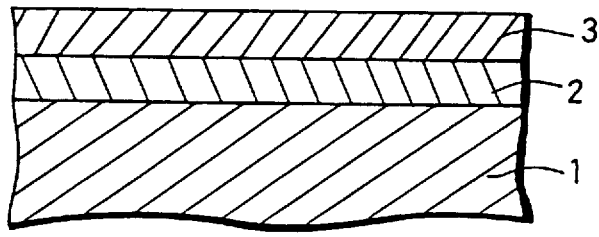
Figure 4:
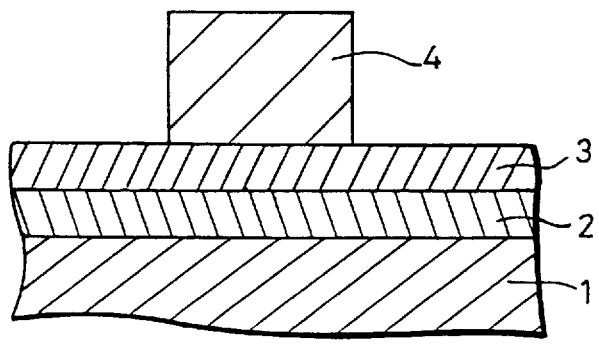

Referring to FIG. 2, interlayer insulating film 1 is formed on the bulk transistor (not shown). A polysilicon layer 2 is deposited as thick as 200 nm on interlayer insulating film 1 by means of thermal chemical vapor deposition. Referring to FIG. 3, a nitride film 3 having a thickness of 200 nm is formed on a polysilicon layer 2 by thermal CVD. Referring to FIG. 4, a resist film is applied onto nitride film 3. Thereafter, the resist film is patterned by a photolithography technique, to form a resist film 4 having a prescribed form.

Figure 5:
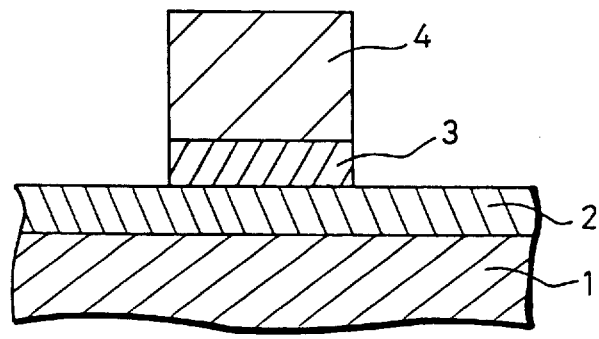
Figure 6:
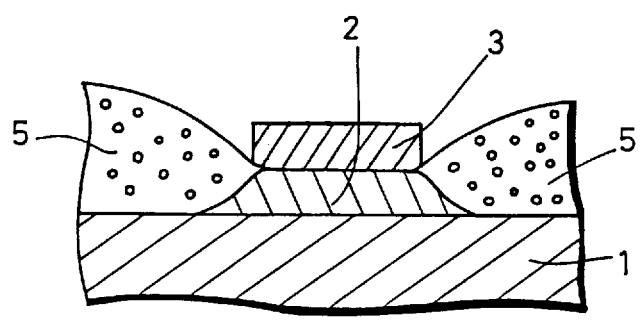

Referring to FIG. 5, using resist film 4 as mask, nitride film 3 is subjected to anisotropic reactive etching to take a prescribed form. Referring to FIG. 6, after removal of resist film 4, first insulating layers 5, 5 are formed on the upper surface of polysilicon layer 2 by thermal oxidation in accordance with LOCOS process. Referring to FIG. 6, gate electrode 2 having the central flat portion and the inclined sidewalls descending rightward and leftward from the right and left ends of the central flat portion is thus formed.

Figure 7:
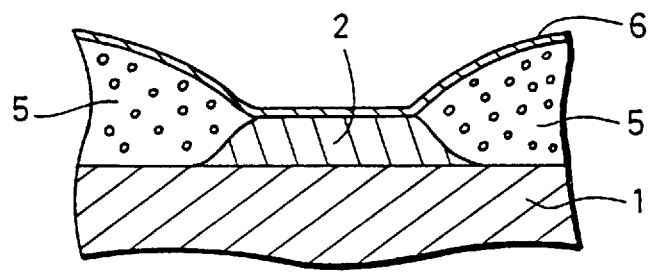
Figure 8:
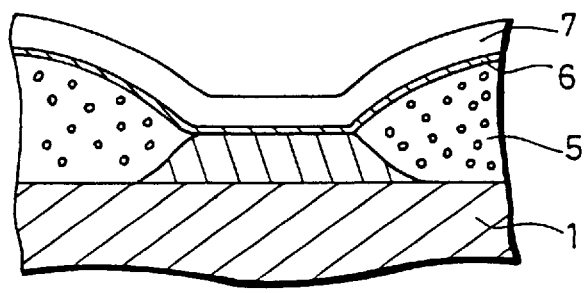
Figure 9:
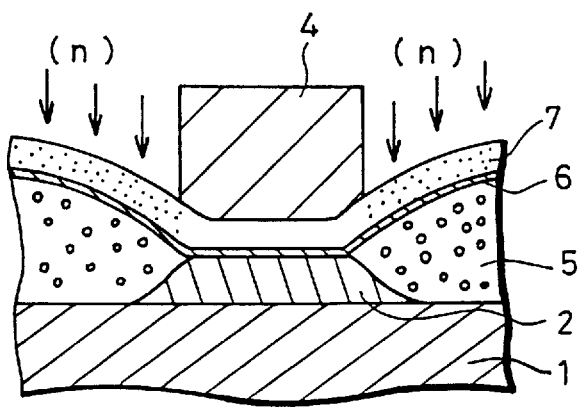
Figure 10:
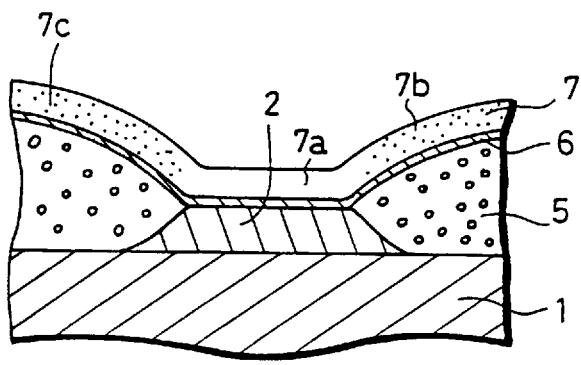

Referring to FIG. 7, after removal of nitride film 3, a gate oxide film 6 having a thickness of 50 nm is formed on the surfaces of gate electrode 2 and first insulating layers 5, 5 by means of thermal chemical vapor deposition. Referring to FIG. 8, a semiconductor layer, a polysilicon layer 7 is deposited as thick as 50 nm on gate oxide film 6 by thermal CVD. Referring to FIG. 9, a resist film 4 having a prescribed form is formed on the surface of semiconductor layer 7 at the position opposite to the central flat portion of gate electrode 2. Using resist film 4 as mask, an impurity of second type conductivity, for example, n type is introduced at a prescribed position of semiconductor layer 7. Referring to FIG. 10, channel region 7a of p type which is the first type conductivity is formed in semiconductor layer 7 at the position opposite to the central flat portion of gate electrode 2. Source/drain regions 7b, 7c of n type which is the second type conductivity are formed at the positions having channel region 7a therebetween. Thus, TFT in accordance with the present embodiment is completed.

The bent angle is formed to be beyond 90° in the vicinities of the boundaries of channel region 7a and source/drain regions 7b, 7c. Semiconductor layer 7 is therefore formed with no orthogonal bent produced. This allows the concentration of electric fields in channel region 7a to be suppressed.

A description of a structure of a TFT in accordance with a second embodiment in accordance with the present invention follows a conjunction with the accompanying drawings.

Figure 11:
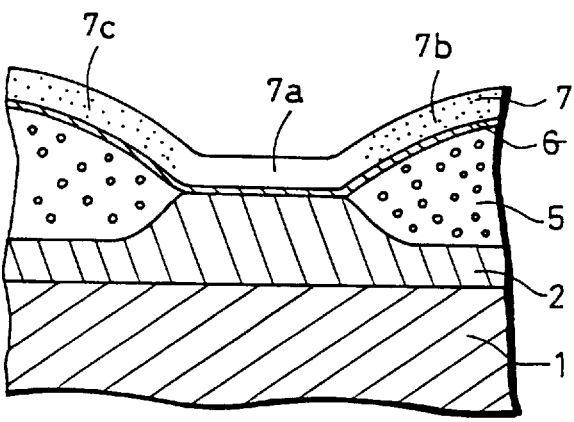
FIG. 11 is a cross sectional view showing a structure of a thin film transistor in accordance with a second embodiment of the present invention.

Referring to FIG. 11, the structure of the TFT in accordance with the second embodiment has a substantially identical structure to the TFT in the aforementioned first embodiment. The gate electrode 2 of the TFT described above has a structure isolated from first insulating layers 5, 5. The TFT in accordance with the second embodiment has polysilicon layer 2 for forming gate electrode 2 deposited thicker than usual. Thus, gate electrode 2 exists on the entire surface of interlayer insulating film 1.

Figure 13:
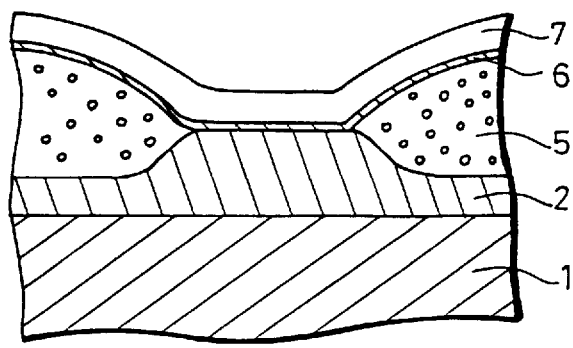
Figure 14:
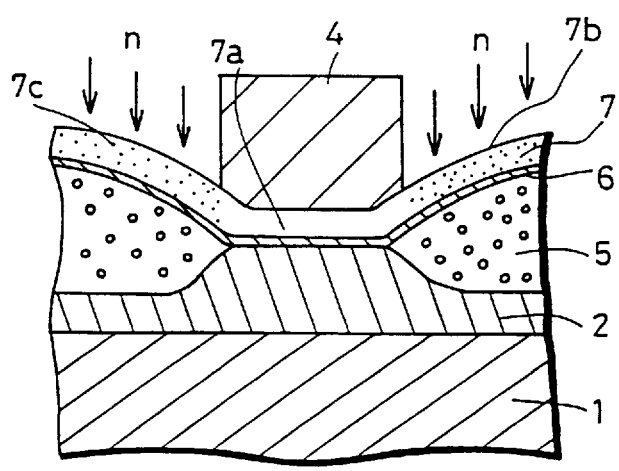

Now, a manufacturing process of the TFT in accordance with the second embodiment will be described in conjunction with FIGS. 12 to 14.

Figure 12:
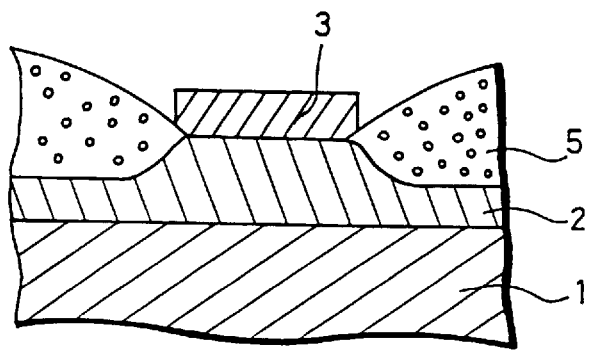
FIGS. 12 to 14 are cross sectional views showing a manufacturing process of the thin film transistor in accordance with the second embodiment of the present invention.

Referring to FIG. 12, an interlayer insulating film 1 is formed on a bulk transistor (not shown). A polysilicon layer 2 for forming a gate electrode is formed by thermal CVD on the interlayer insulating film as thick as 400 nm which is thicker than the case of the first embodiment. Thereafter, going through the same manufacturing process as the TFT in accordance with the first embodiment, the TFT in accordance with the second embodiment is formed.

Also in this structure, as is the case with the TFT in accordance with the first embodiment described above, the bent angle is formed to be beyond 90° in the vicinities of the boundaries of channel region 7a and source/drain regions 7b, 7c, and, therefore, an orthogonal bent is not formed in semiconductor layer 7. This allows the concentration of electric fields to be suppressed in channel region 7a. With gate electrode 2 existing on the entire surface of interlayer insulating film 1, making a contact with gate electrode 2 is possible at an arbitrary position on the substrate.

A structure of a TFT in accordance with a third embodiment of the present invention follows.

Figure 15:
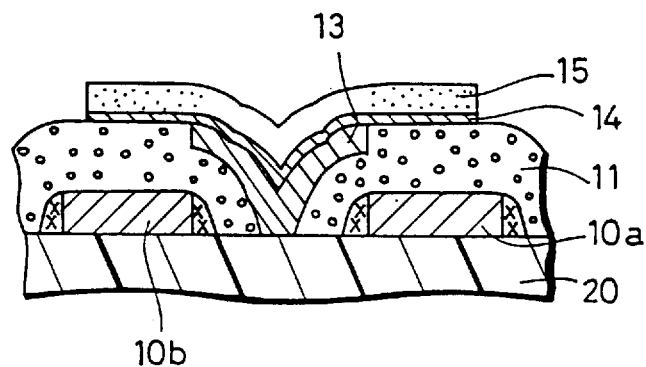
FIG. 15 is a cross sectional view showing a structure of a thin film transistor in accordance with a third embodiment of the present invention.

Referring to FIG. 15, the TFT in accordance with a third embodiment is formed between the gate electrode 10a and gate electrode 10b of the bulk transistor with sidewalls formed on a silicon substrate 20. First insulating layers 11, 11 are formed on gate electrode 10a and gate electrode 10b. The gate electrode 13 of the TFT having an approximately V shape is formed on first insulating layers 11, 11. A gate oxide film 14 is formed on the surfaces of first insulating layers 11, 11 and gate electrode 13. A polysilicon layer 15 is formed on the upper surface of gate oxide film 14.

A manufacturing process of the TFT in accordance with the third embodiment will be described in conjunction with FIGS. 16 to 22.

Figure 16:
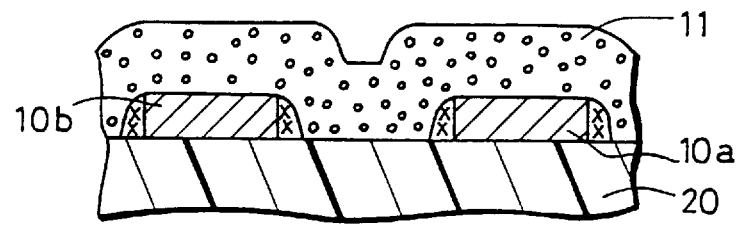
FIGS. 16 to 22 are cross sectional views showing a manufacturing process of the thin film transistor in accordance with the third embodiment of the present invention.
Figure 17:
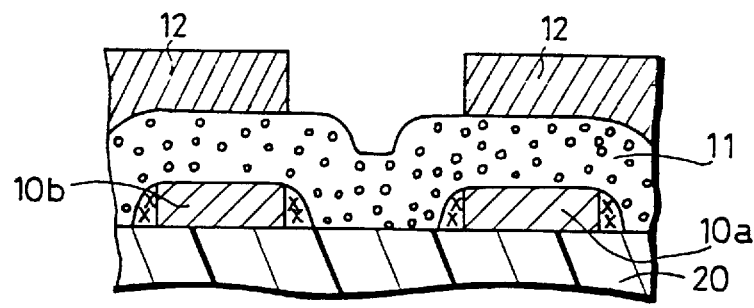
Figure 18:
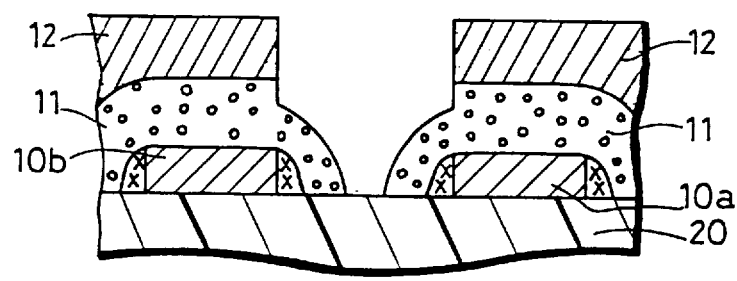

Referring to FIG. 16, formed on semiconductor substrate 20 are gate electrodes 10a and 10b. First insulating layer 11 is deposited as thick as 300 nm on gate electrodes 10a and 10b by thermal chemical vapor deposition. Referring to FIG. 17, a resist film patterned into a prescribed form is formed on interlayer insulating film 11 by a photolithography technique. Referring to FIG. 18, first insulating layer 11 between gate electrodes 10a and 10b is removed away by anisotropic reactive ion etching, thereby forming an opening leading to semiconductor substrate 20.

Figure 19:
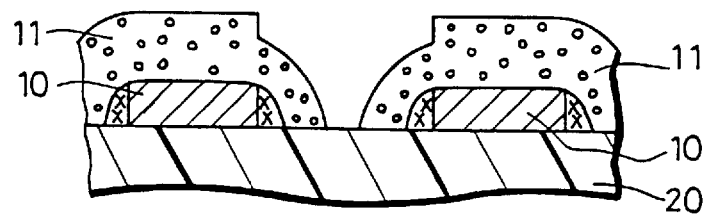
Figure 20:
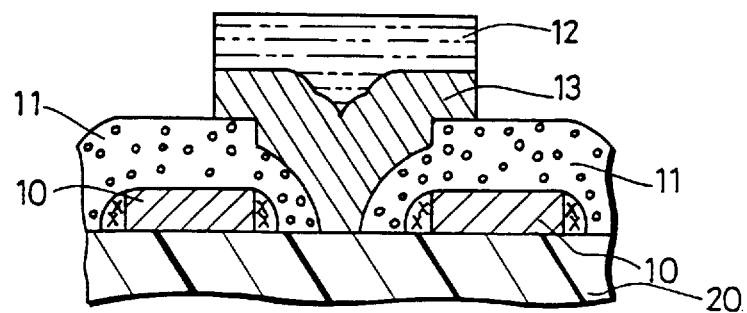
Figure 21:
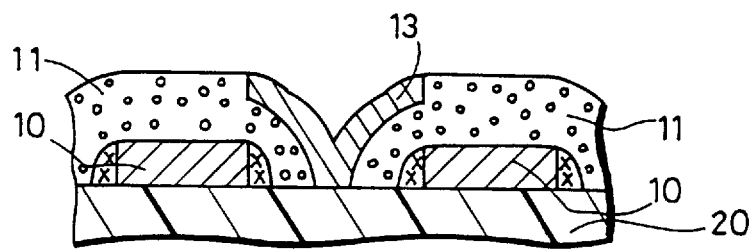

Referring to FIG. 19, resist film 12 is removed. Referring to FIG. 20, polysilicon layer 13 for gate electrode is deposited as thick as 300 nm on interlayer insulating film 11 by thermal chemical vapor deposition. Thereafter, resist film 12 is applied onto polysilicon layer 13. Resist film 12 is then patterned into a prescribed form by a photolithography technique. Referring to FIG. 21, resist film 12 is removed. Thereafter, TFT gate electrode 13 is formed by anisotropic reactive ion etching.

Figure 22:
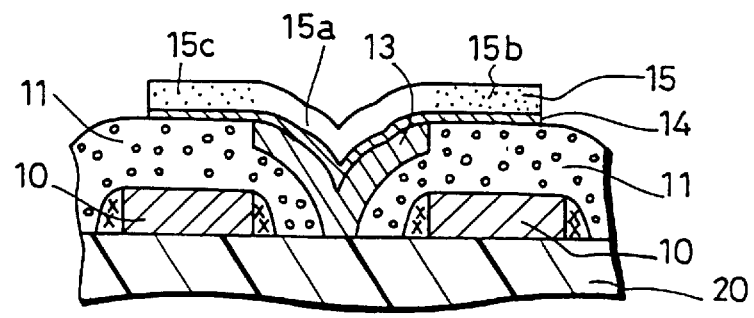

Referring to FIG. 22, gate oxide film 14 having a thickness of 50 nm is formed on gate electrode 13 and first insulating layers 11, 11 by thermal CVD. Polysilicon layer 15 for forming the TFT semiconductor layer is deposited as thick as 50 nm on gate oxide film 14 by thermal CVD. Thereafter, a resist film (not shown) is formed on the surface of polysilicon layer 15 opposite to gate electrode 13. Using the resist film as mask, an impurity of the second type conductivity is introduced at a prescribed position of polysilicon layer 15. Thus, polysilicon layer 15 is formed with no orthogonal bent formed. Channel region 15a of first type conductivity, for example, p type is formed at the position opposite to gate oxide film 13. Source/drain regions 15b, 15c of second type conductivity, for example, n type are formed at positions having channel region 15a therebetween.

According to the above-stated structure, the bent angle in the vicinities of the boundaries of channel region 15a and source/drain regions 15b, 15c is formed to be beyond 90°. The concentration of electric fields can therefore be suppressed by the formation of the semiconductor layer with no orthogonal bent produced in the semiconductor layer.

Now, a TFT in accordance with a fourth embodiment of the present invention will be described in conjunction with the accompanying drawings.

Figure 23:
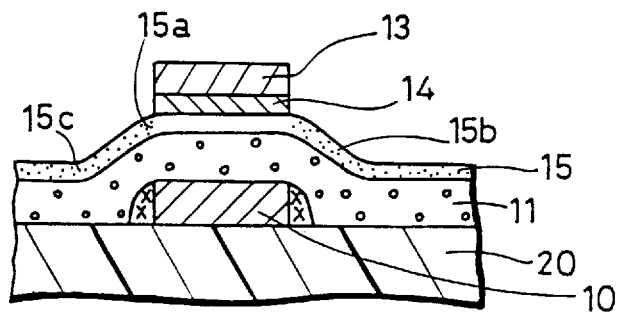
FIG. 23 is a cross sectional view showing a structure of a thin film transistor in accordance with a fourth embodiment of the present invention.
Figure 24:
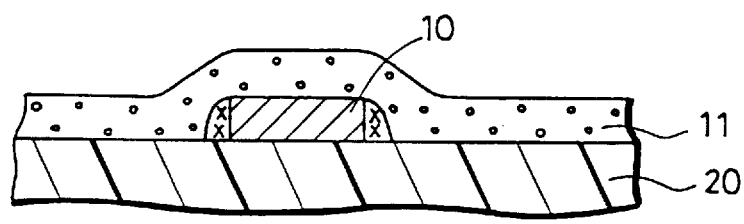
FIGS. 24 to 29 are a cross sectional view showing a structure manufacturing process of the thin film transistor in accordance with the fourth embodiment of the present invention.
Figure 25:
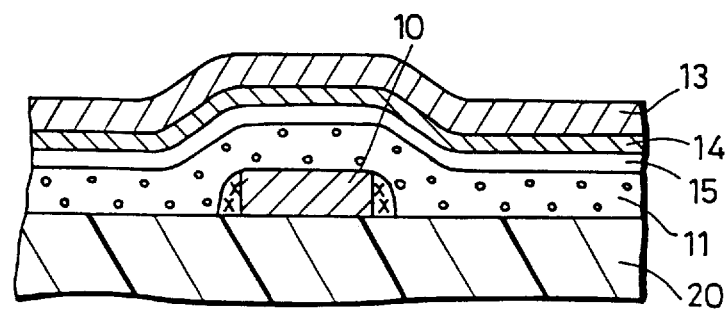

Referring to FIG. 23, the TFT in accordance with the fourth embodiment is formed immediately above the gate electrode 10 of bulk transistor. A description of a manufacturing process of the TFT having this structure follows in conjunction with FIGS. 24 to 29. Referring to FIG. 24, first insulating layer 11 is formed on the gate electrode 10 of the bulk transistor. Referring to FIG. 25, a semiconductor layer 15 formed of polysilicon is deposited on the surface of first insulating layer 11 by thermal CVD. Thereafter, a gate oxide film 14 is formed on the semiconductor layer 15. Gate electrode layer 13 is formed on gate oxide film 14.

Figure 26:
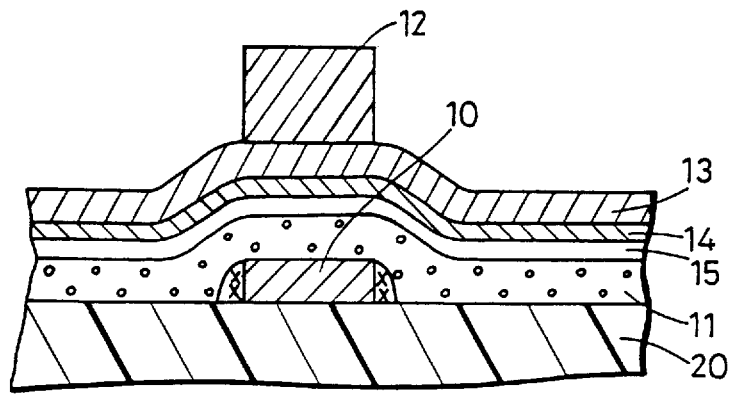
Figure 27:
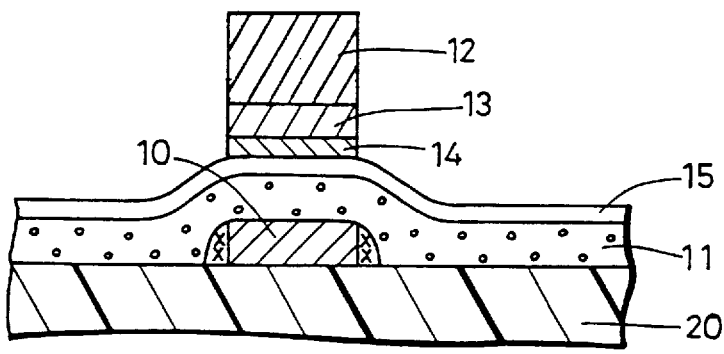
Figure 28:
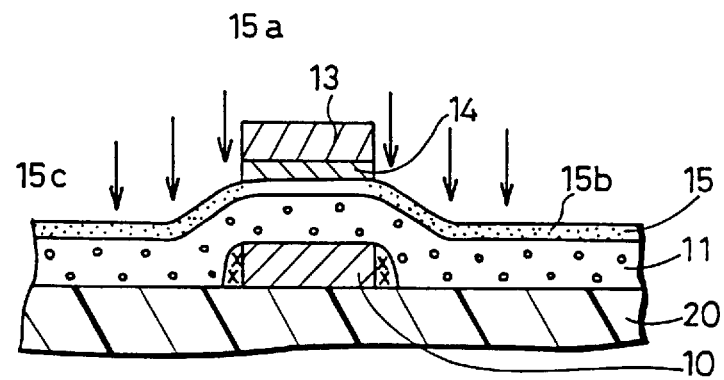
Figure 29:
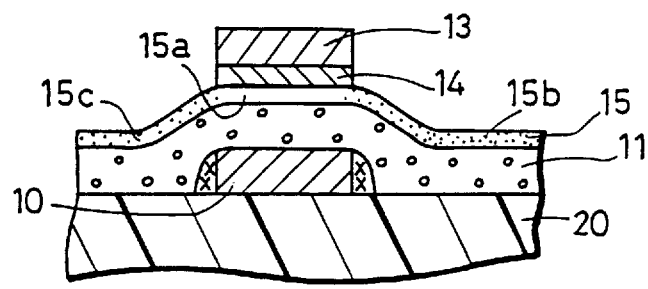

Referring to FIG. 26, a resist film 12 is applied onto gate electrode layer 13 and the structure is etched into a prescribed form by means of a photolithography technique. Referring to FIG. 27, using resist film 12 as mask, gate electrode layer 13 and gate oxide film 14 are subjected to reactive anisotropic ion etching into prescribed forms. Referring to FIG. 28, a resist film 12 is removed away. Thereafter, using gate electrode 13 as mask, an impurity of the second type conductivity is introduced into semiconductor layer 15. Referring to FIG. 29, a p type channel region 15a is formed in semiconductor layer 15 which is the lower portion of the gate electrode 13 of the TFT. N source/drain regions 15b, 15c are formed in the right and left regions of semiconductor layer 15 having p channel region 15a therebetween. Thus, the TFT in accordance with the fourth embodiment is completed.

As described above, the formation of the TFT immediately above bulk transistor 10 allows suppression of the concentration of electric fields at a bent, because the bent angle at each of the positions in the vicinities of the boundaries of channel region 15a and source/drain regions 15b, 15c is formed to be beyond 90° and an orthogonal bent is not formed in semiconductor layer 15.

Now, a description of a TFT in accordance with the fifth embodiment of the present invention follows.

Figure 30:
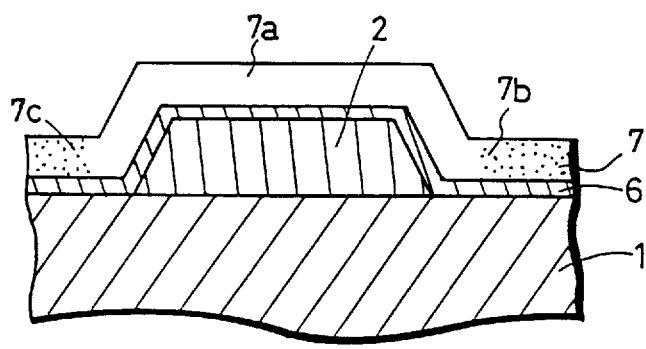
FIG. 30 is a cross sectional view showing a structure of a thin film transistor in accordance with a fifth embodiment of the present invention.

Referring to FIG. 30, in the structure of the TFT in accordance with the fifth embodiment, a gate electrode 2 having a central flat portion and sidewalls formed broaden downwardly at a prescribed inclination with respect to both sides of the central flat portion is formed on an interlayer insulating film 1. A gate oxide film 6 is formed along the central flat portion and sidewalls of gate electrode 2. A semiconductor layer 7 is formed along the surface of gate oxide film 6. A channel region 7a of first type conductivity, for example, p type is formed at the position opposite to the central flat portion of gate electrode 2. Source/drain regions 7b, 7c of second type conductivity, for example, n type are formed at the positions having p type channel region 7a therebetween.

A manufacturing process of the TFT having the above-stated structure will be described in conjunction with FIGS. 31 to 36.

Figure 31:
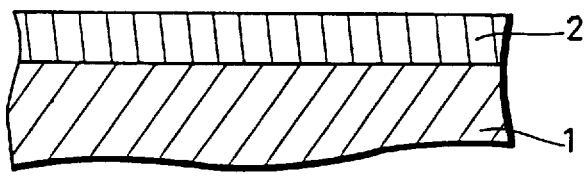
FIGS. 31 to 36 are cross sectional views showing a manufacturing process of the thin film transistor in accordance with the fifth embodiment of the present invention.
Figure 32:
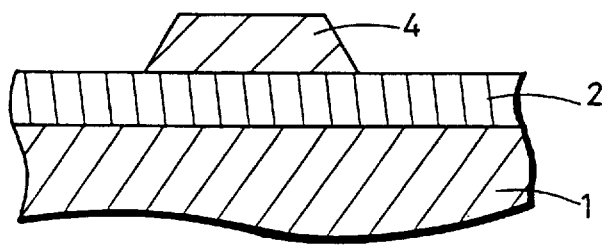
Figure 33:
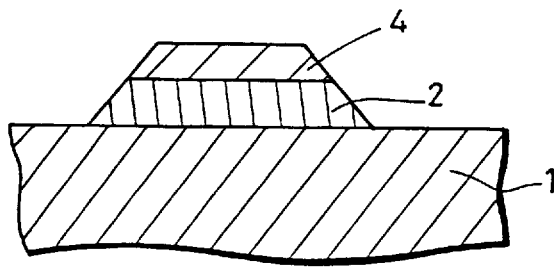
Figure 34:
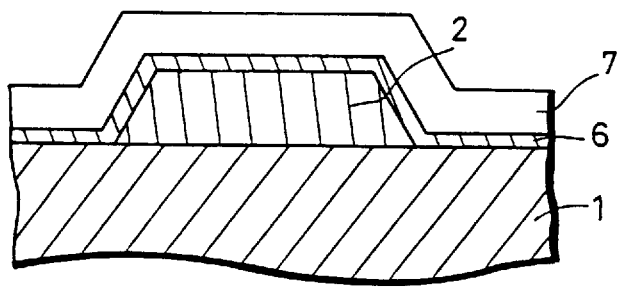
Figure 35:
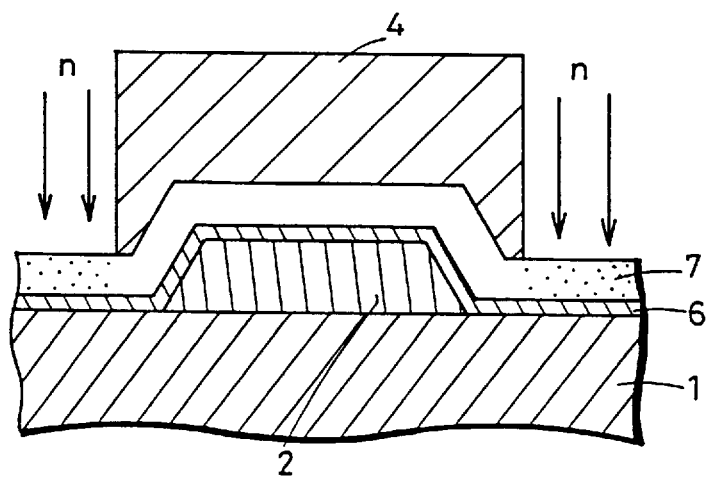
Figure 36:
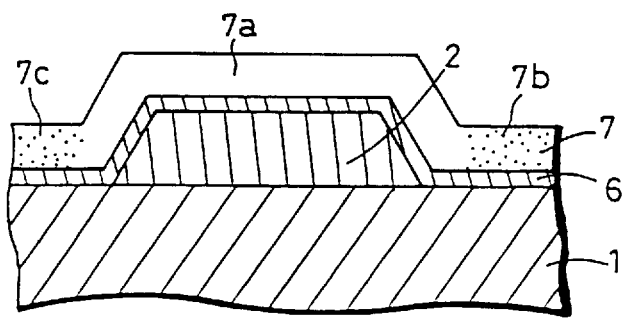

Referring to FIG. 31, a polysilicon layer 2 to form a gate electrode is formed on interlayer insulating film 1. Referring to FIG. 32, a resist film having a central flat portion and sidewalls formed broaden downwardly at a prescribed inclination angle with respect to both sides of the central flat portion. Referring to FIG. 33, using resist film 4 as mask, polysilicon layer 2 is subjected to reactive anisotropic ion etching, thus, polysilicon layer 2 is formed to be gate electrode 2 corresponding to the form of resist film 4 and having a central flat portion and sidewalls formed broaden downwardly having a prescribed inclination with respect to both sides of the central flat portion. Referring to FIG. 34, resist film 4 is removed away. Thereafter, a gate oxide film 6 is formed on gate electrode 2. Semiconductor layer 7 is formed on gate oxide film 6. Referring to FIG. 35, resist film 4 having a prescribed form is formed in the area opposite to the surface of, the semiconductor layer 7 of gate electrode 2. Using resist film 4 as mask, an impurity of second type conductivity, for example, n type is introduced into semiconductor layer 7. Thus, channel region 7a of the first type conductivity, for example, p type is formed in the region opposite to the gate electrode 2 of semiconductor layer 7. Source/drain regions 7b, 7c of the second type conductivity, for example, n type are formed at the positions of semiconductor layer 7 having channel region 7a therebetween. Thus, the TFT in accordance with the fifth embodiment is completed. In the TFT having the above-stated structure, as the bent angle in the vicinities of the boundaries of channel region 7a and source/drain regions 7b, 7c is formed to be beyond 90°, no orthogonal bent is formed in semiconductor layer 7, and, therefore, the concentration of electric fields in the orthogonal bent of the conventional semiconductor layer can be suppressed.

Figure 37:
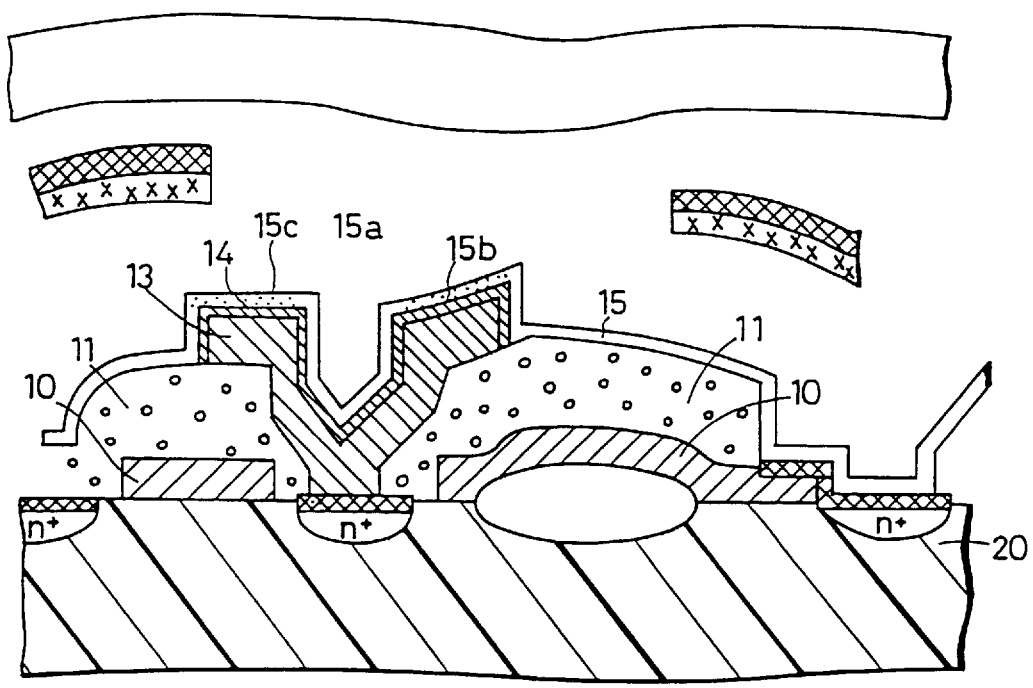
FIG. 37 is a cross sectional view showing a structure of a thin film transistor in accordance with a third embodiment of the present invention, being used in an SRAM memory cell.

Referring to FIG. 37, a cross section of the TFT in accordance with the third embodiment used for an SRAM memory cell is shown.

As in the foregoing, according to the embodiment of the present invention, the semiconductor layer formed in the thin film transistor is formed in such a manner that no orthogonal bent is produced. Thus, the concentration of electric fields in the orthogonal bent of the semiconductor layer according to the conventional technique can be prevented. Furthermore, hot carriers created by the concentration of electric fields can be suppressed from getting into the insulating film. Consequently, a stable operation of the semiconductor device is secured, and a highly reliable TFT can be provided.

A sixth embodiment of the present invention will now be described in conjunction with the figures. In an SRAM cell in accordance with the sixth embodiment, a gate electrode of a driver transistor has a ring shape when it is viewed two-dimensionally, and the thin film transistor described in the third embodiment is used for a load transistor.

Figure 38:
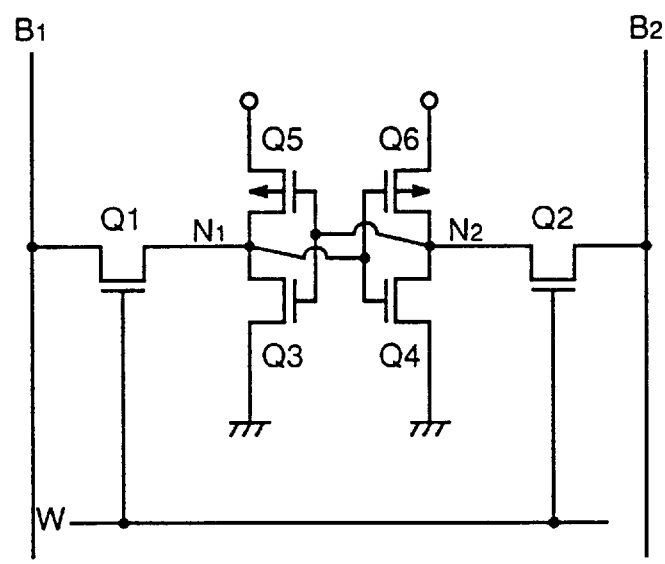
FIG. 38 is a diagram showing an equivalent circuit of an SRAM cell in accordance with a sixth embodiment of the present invention.

FIG. 38 is a diagram showing an equivalent circuit of an SRAM cell. An SRAM cell generally includes a flip-flop circuit constituted by a pair of driver transistors $Q_3$ and $Q_4$ as well as a pair of load transistors $Q_5$ and $Q_6$ as shown in the figure.

A pair of access transistors $Q_1$ and $Q_2$ are connected to a pair of storage nodes $N_1$ and $N_2$ of the flip-flop circuit, respectively, so that whether bit potentials $B_1$ and $B_2$ are supplied or not can be selected by word potential W.

A sectional structure of a memory cell having the above-mentioned circuitry will now be described in conjunction with FIGS. 39 to 43. It is noted that the structure of the memory cell of FIG. 39 is a cross section taken along the line A–A' of FIGS. 40 to 43.

Figure 39:
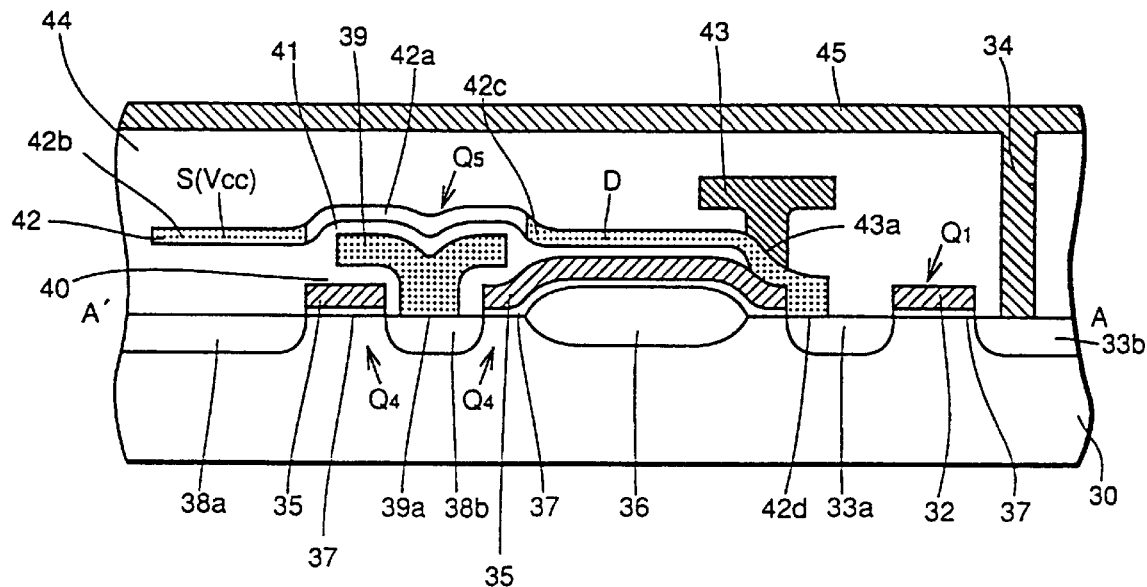
FIG. 39 is a cross sectional view showing a structure of an SRAM cell in accordance with the sixth embodiment of the present invention.
Figure 40:
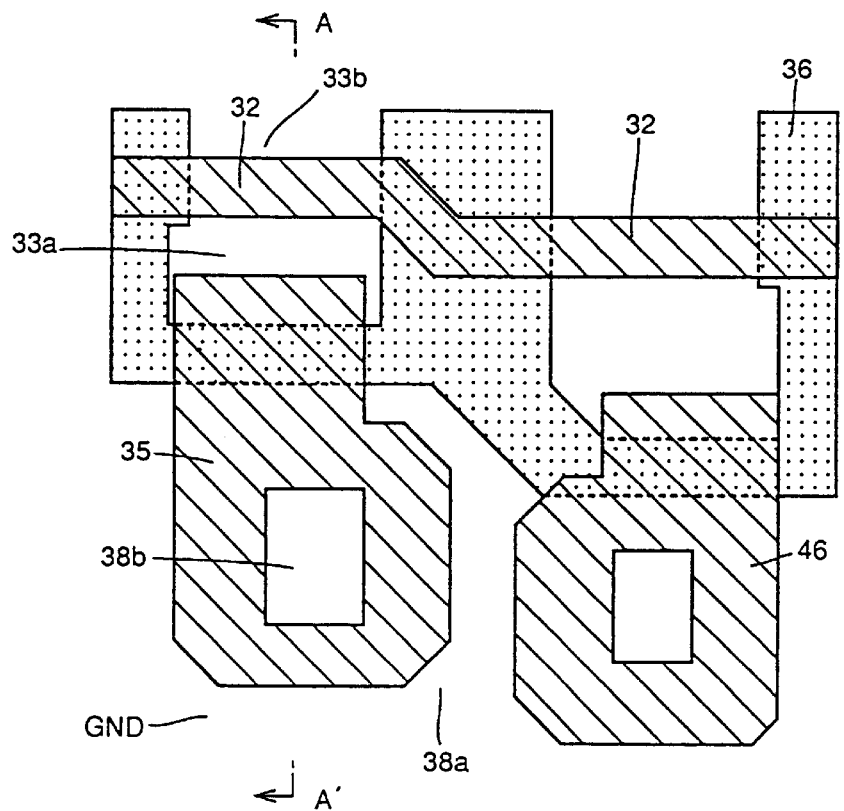
FIGS. 40 to 43 are plans showing a structure of an SRAM cell in accordance with the sixth embodiment of the present invention.

First, referring to FIGS. 39 and 40, an isolation oxide film 36 is formed at a prescribed region of a main surface of a semiconductor substrate 30. A pair of impurity regions 33a and 33b of access transistor $Q_1$ and a pair of impurity regions 38a and 38b of driver transistor $Q_4$ are formed at prescribed regions of the main surface of semiconductor substrate 30 which are defined by isolation oxide film 36.

A gate electrode 35 of driver transistor $Q_4$ is formed on semiconductor substrate 30 with a gate oxide film 37 therebetween so as to have a ring shape to expose impurity region 38b and so as to extend over isolation oxide film 36. In addition, a gate electrode 32 of access transistor $Q_1$ is formed on semiconductor substrate 30 with gate oxide film 37 therebetween to have a prescribed shape.

Figure 41:
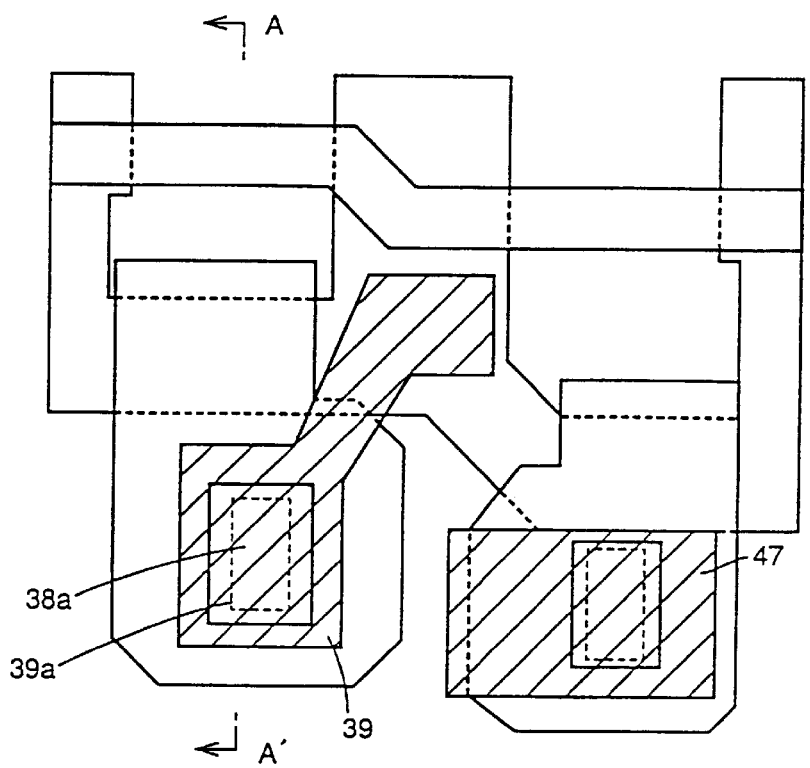

Referring to FIGS. 39 and 41, a gate electrode 39 of load transistor $Q_5$ is formed on impurity region 38b, and impurity region 38b and gate electrode 39 of load transistor $Q_5$ form a first contact portion 39a. A first interlayer oxide film 40 is interposed between gate electrode 39 of load transistor $Q_5$ and gate electrode 35 of driver transistor $Q_4$.

Figure 42:
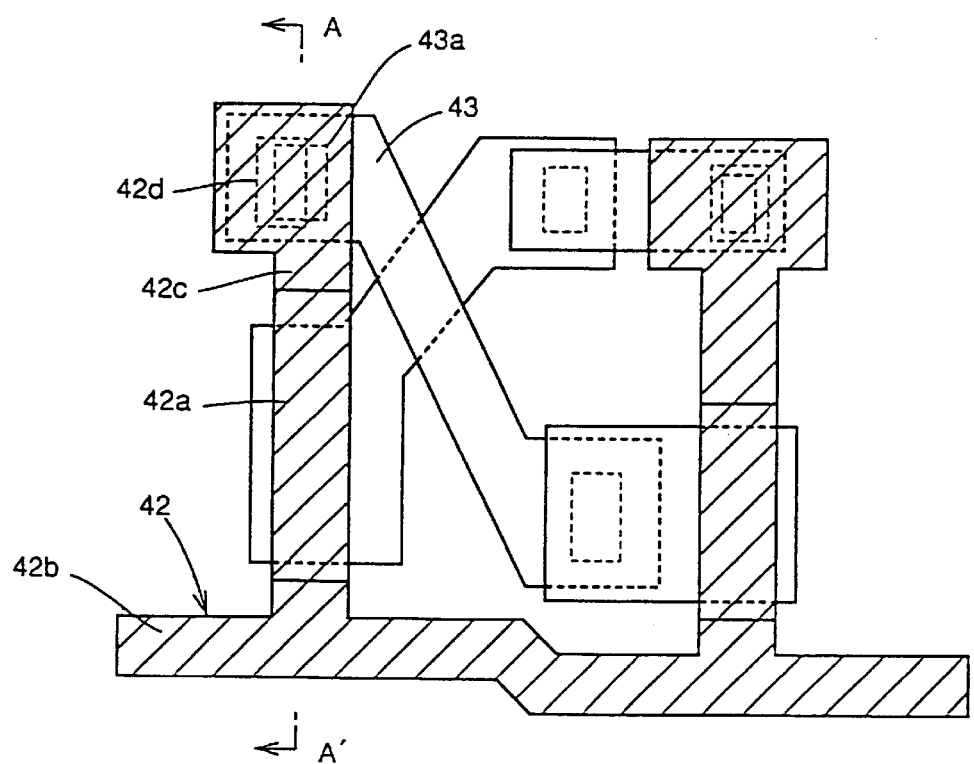

Referring to FIGS. 39 and 42, a first conductive layer 42 is formed above gate electrode 39 of load transistor $Q_5$ with a second interlayer oxide film 41 therebetween. First conductive layer 42 is formed to have its one end extended over impurity region 38a of driver transistor $Q_4$ and the other end extended near impurity region 33a of access transistor $Q_1$.

First conductive layer 42 includes a channel region 42a formed opposite to gate electrode 39 of load transistor $Q_5$ as well as source/drain regions 42b and 42c formed to sandwich the channel region 42a.

A thin film transistor is formed by gate electrode 39, channel region 42a and source/drain regions 42b and 42c.

Gate electrode 35 of driver transistor $Q_4$, drain region 42c of load transistor $Q_5$ and a second conductive layer 43 are electrically connected to one of a pair of impurity regions 33a of access transistor $Q_1$.

Figure 43:
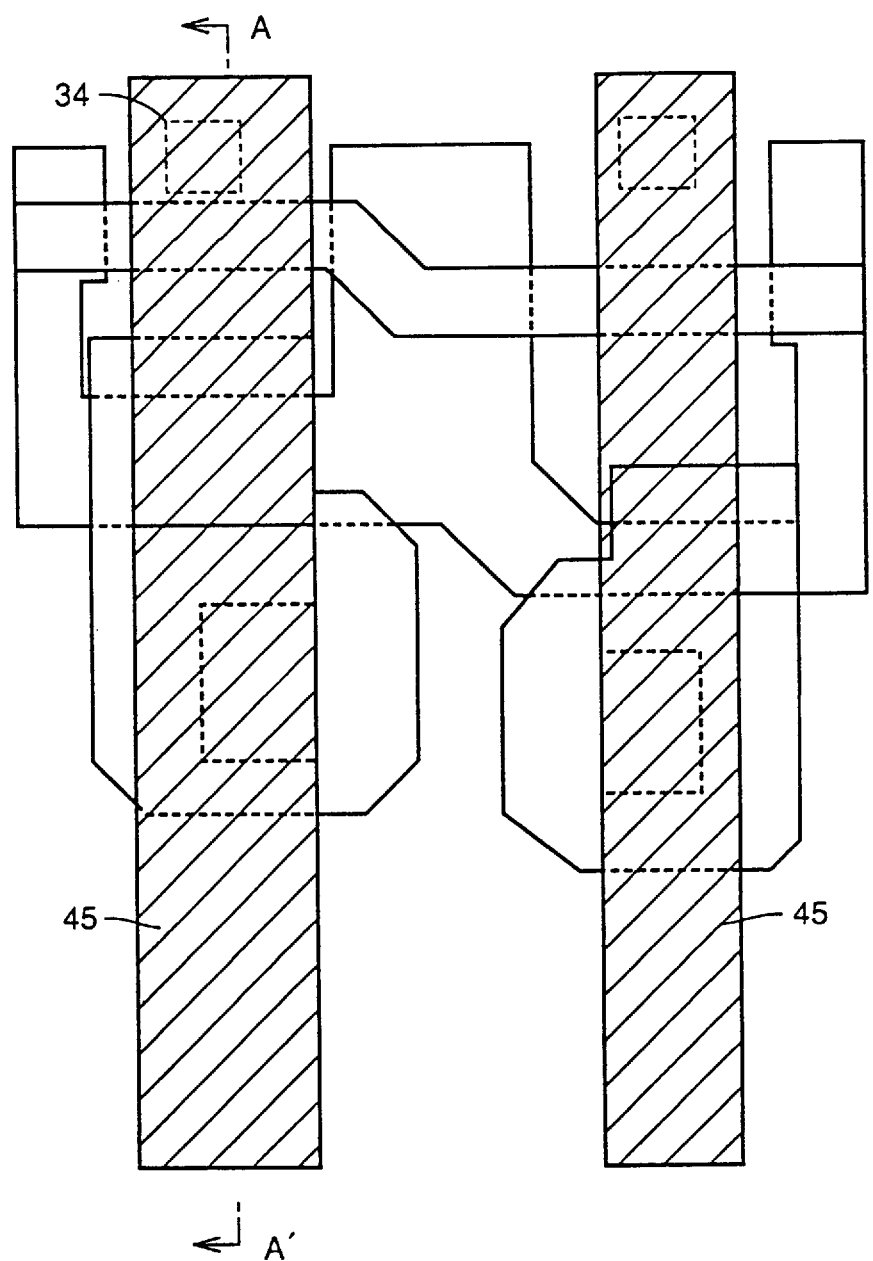

Referring to FIGS. 39 and 43, in one of a pair of impurity regions 33b of access transistor $Q_1$, a bit line 45 is formed through a contact hole 34 provided in a third interlayer oxide film 44.

As has been described above, in an SRAM cell in accordance with the sixth embodiment, first conductive layer 42 is formed such that its bent angle is beyond 90° at each of positions near the boundaries of channel region 42a and source/drain regions 42c and 42b as in the case of the third embodiment. Consequently, gate electrode 39 of load transistor $Q_4$ is formed with no orthogonal bent produced, resulting in suppression of the concentration of electric fields.

A seventh embodiment in accordance with the present invention will now be described in conjunction with the figures. The seventh embodiment includes a thin film transistor in a region sandwiched between gate electrodes of an access transistor and a driver transistor which are arranged in parallel.

Since an equivalent circuit diagram of an SRAM cell in accordance with the seventh embodiment is similar to that shown in FIG. 38 in the sixth embodiment, description thereof will not be repeated.

A sectional structure of an SRAM cell in accordance with the seventh embodiment will now be described in conjunction with FIGS. 44 to 47.

Figure 44:
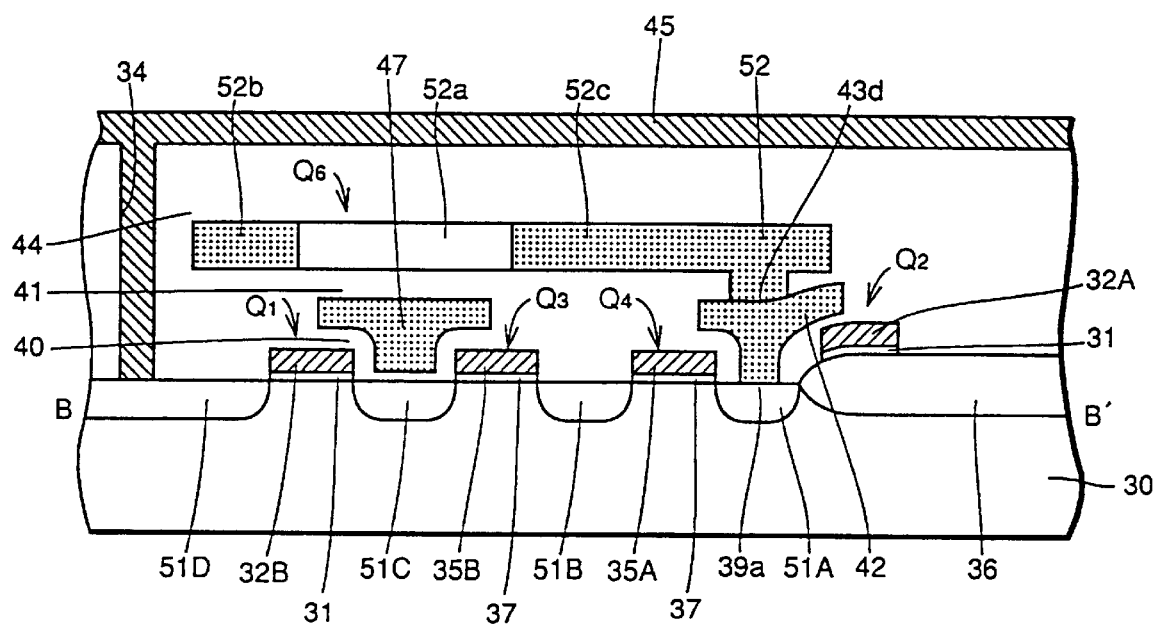
FIG. 44 is a cross sectional view showing a structure of an SRAM cell in accordance with a seventh embodiment of the present invention.
Figure 45:
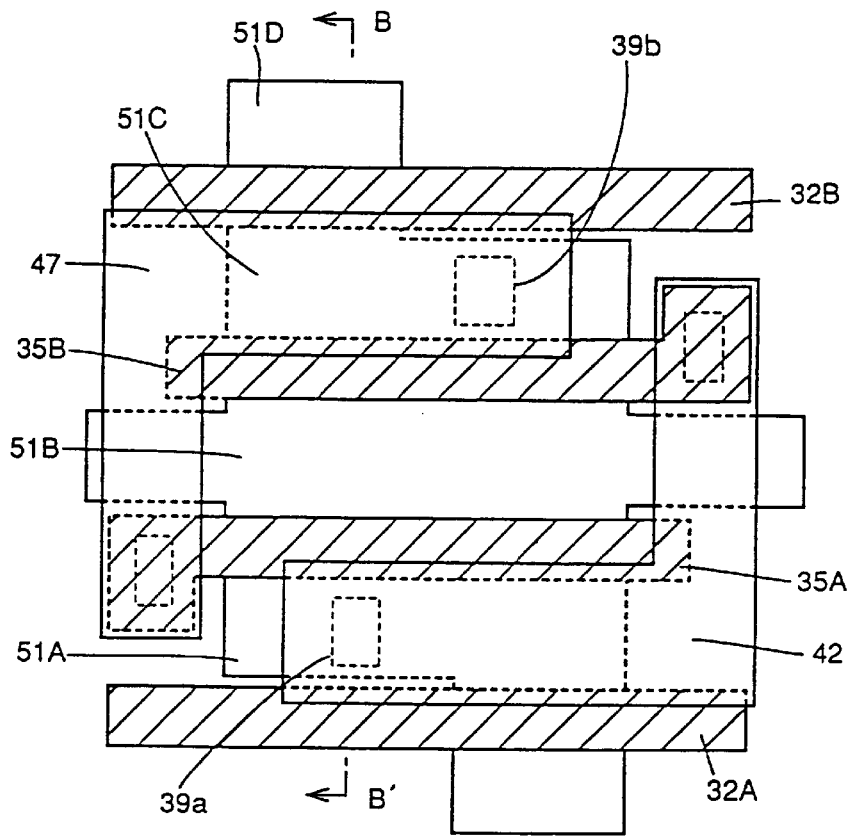
FIGS. 45 to 47 are plans showing a structure of an SRAM cell in accordance with the seventh embodiment of the present invention.
Figure 46:
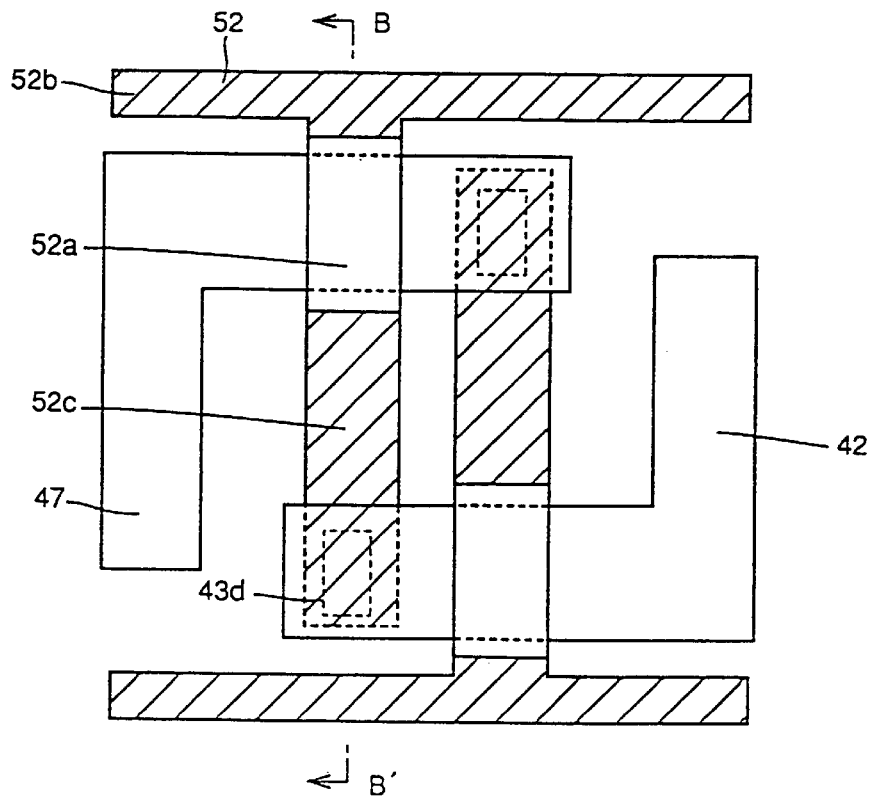
Figure 47:
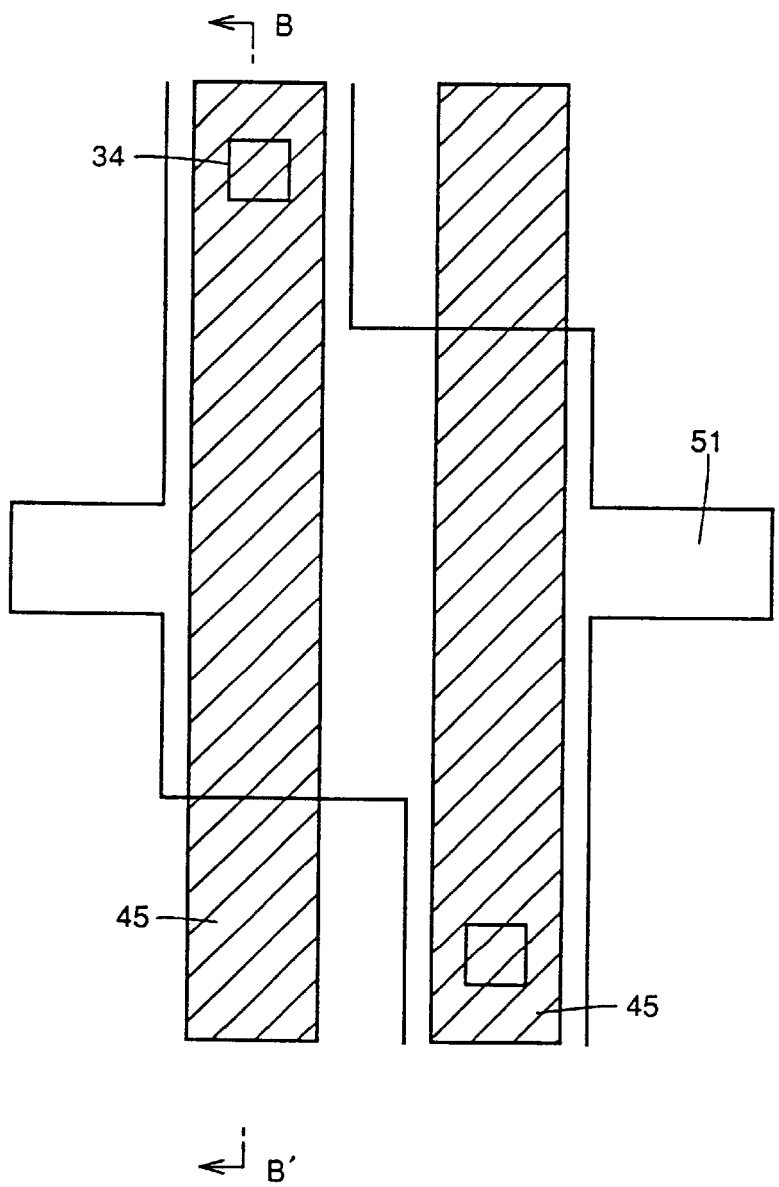
Figure 48:
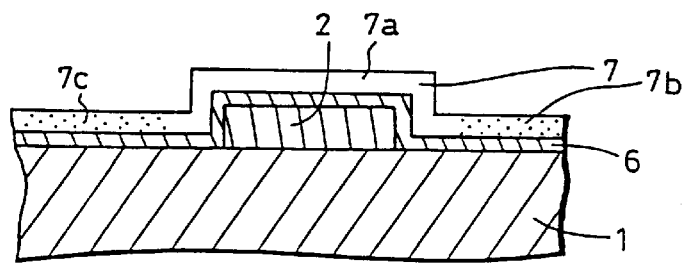
FIG. 48 is a cross sectional view showing a structure of a thin film transistor in accordance with a conventional technique.
Figure 49:
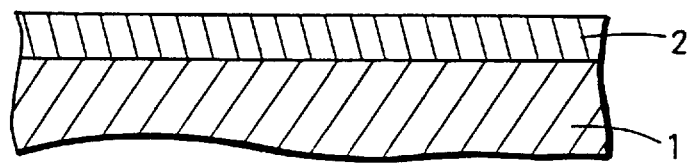
FIGS. 49 to 55 are cross sectional views showing a manufacturing process of the thin film transistor in accordance with the conventional technique.
Figure 50:
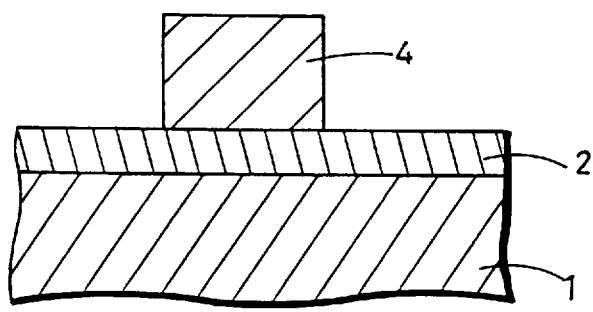
Figure 51:
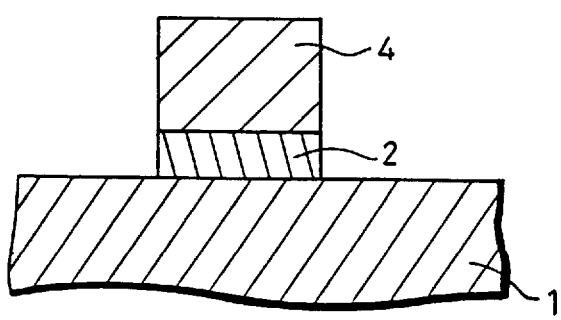
Figure 52:
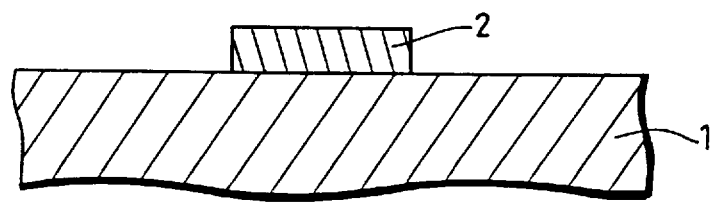
Figure 53:
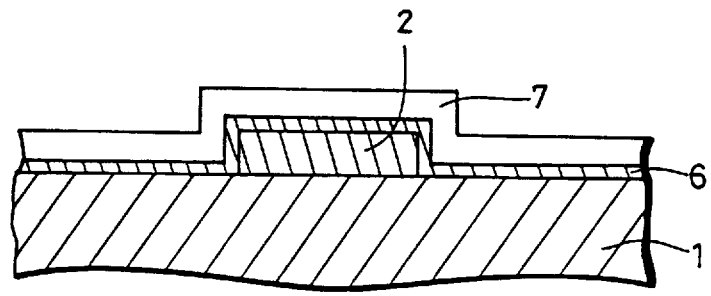
Figure 54:
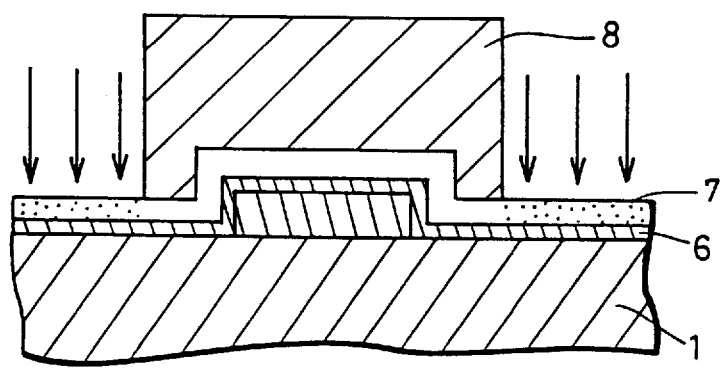
Figure 55:
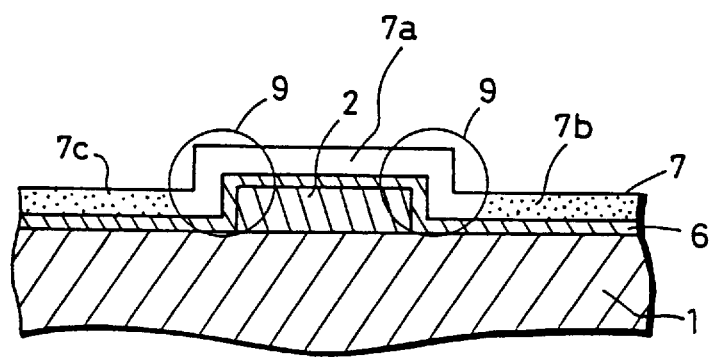

FIGS. 44 is a cross section taken along the line B–B' of FIGS. 45 to 47.

First, referring to FIGS. 44 and 45, an isolation oxide film 36 is formed at a prescribed region of a main surface of a semiconductor substrate 30. First to fourth impurity regions 51A, 51B, 51C and 51D are formed at prescribed regions of the main surface of semiconductor substrate 30 which are defined by isolation oxide film 36. A gate electrode 32A of an access transistor $Q_2$, a gate electrode 35A of a driver transistor $Q_4$, a gate electrode 35B of a driver transistor $Q_3$ and a gate electrode 32B of an access transistor $Q_1$ are formed in a region sandwiched between first impurity region 51A and fourth impurity region 51D with a gate oxide film 31 or 37 therebetween.

A gate electrode 47 of a load transistor $Q_6$ is formed between gate electrode 32B of access transistor $Q_1$ and gate electrode 35B of driver transistor $Q_3$ with a first interlayer oxide film 40 interposed.

A first conductive layer 42 is formed between gate electrode 35A of driver transistor $Q_4$ and gate electrode 32A of access transistor $Q_2$.

Referring to FIGS. 44 and 46, a second conductive layer 52 is formed above gate electrode 47 of load transistor $Q_6$ with a second interlayer oxide film 41 therebetween. As shown in FIG. 45, gate electrode 47 is connected to impurity region 51C at contact 39b. A channel region 52a is formed opposite to gate electrode 47 of load transistor $Q_6$ of second conductive layer 52, and source/drain regions 52b and 52c are formed to sandwich the channel region 52a. Drain region 52c is electrically connected to first conductive layer 42 and they from a second contact portion 43d.

Referring to FIGS. 44 and 47, a bit line 45 is formed in fourth impurity region 51D through a contact hole 34 provided in a third interlayer oxide film 44.

As has been described above, in an SRAM cell in accordance with the seventh embodiment, gate electrode 47 of load transistor $Q_6$ and second conductive layer 42 are formed with no orthogonal bent created as in the above-described sixth embodiment, resulting in suppression of the concentration of electric fields.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including an SRAM cell having a pair of access transistors, a pair of driver transistors and a pair of load transistors on a semiconductor substrate, comprising:

a first impurity region formed at a region of said semiconductor substrate sandwiched between a gate electrode of one of said pair of access transistor and a gate electrode of one of said pair of driver transistors;

a second impurity region formed at a region of said semiconductor substrate sandwiched between a gate electrode of another access transistor and a gate electrode of another driver transistor, without a gate electrode of a driver transistor between said second impurity region and said gate electrode of another access transistor;

a gate electrode of one of said load transistors connected to said second impurity region;

a channel region of said one of the load transistors formed across the gate electrode of said one of the load transistors with an insulating film therebetween; and a pair of source/drain regions of said one of the load transistors formed to sandwich said channel region, wherein one of the pair of source/drain regions of said one of the load transistors is connected to said first impurity region; and the channel region of the load transistor and a first impurity region connected to one of the pair of source/drain regions are provided shifted from each other.

2. The semiconductor device according to claim 1, wherein said access transistors and said driver transistors are bulk transistors, and said one of the load transistors is a thin film transistor.

3. The semiconductor device of claim 1, wherein the channel region of said one of the load transistors is provided between the gate electrode of one of said pair of driver transistors and the gate electrode of one of said pair of access transistors.

4. The semiconductor device according to claim 1, wherein the gate electrodes of the access and driver transistors extend parallel to one another.

5. The semiconductor device according to claim 1, wherein the channel region of said one of the load transistors extends between the gate electrode of said another access transistor and said gate electrode of said another driver transistor.

6. The semiconductor device according to claim 1, wherein the gate electrode of said one of said load transistors is between the second impurity region and the channel region of said one of said load transistors.

7. The semiconductor device of claim 1, wherein a channel region of a load transistor extends between a gate electrode of an access transistor and a gate electrode of a driver transistor.

8. The semiconductor device according to claim 1, wherein the channel region of the load transistor is two-dimensionally linear.

9. A semiconductor device, comprising:

a semiconductor substrate;

a gate electrode of a first access transistor and a gate electrode of a first driver transistor as well as a gate electrode of a second access transistor and a gate electrode of a second driver transistor formed at a prescribed distance away from each other on a main surface of said semiconductor substrate with a gate oxide film therebetween;

a first impurity region formed at the main surface of said semiconductor substrate to be sandwiched between the gate electrode of said first access transistor and the gate electrode of said first driver transistor;

a second impurity region formed at the main surface of said semiconductor substrate to be sandwiched between the gate electrode of said second access transistor and the gate electrode of said second driver transistor, without a gate electrode of a driver transistor between said second impurity region and said gate electrode of said second access transistor;

a first conductive layer electrically connected to said first impurity region and formed above the gate electrode of said first access transistor and the gate electrode of said first driver transistor with a first interlayer insulating film therebetween;

a gate electrode of a load transistor formed above said second impurity region with said first interlayer insulating film therebetween to extend over the gate electrode of said second access transistor and the gate electrode of said second driver transistor; and a second conductive layer formed above the gate electrode of said load transistor with a second interlayer insulating film therebetween, having a channel region of the load transistor formed across the gate electrode of said load transistor and a pair of impurity regions of the load transistor formed to sandwich the channel region, and having one of the pair of impurity regions of said load transistor electrically connected to said first conductive layer, wherein the channel region of the load transistor and a first impurity region connected to one of the pair of source/drain regions are provided shifted from each other.

10. The semiconductor device according to claim 9, wherein said first and second access transistors as well as said first and second driver transistors are bulk transistors, and said load transistor is a thin film transistor.

11. The semiconductor device of claim 9, wherein the channel region of said load transistor is provided between the gate electrode of said second driver transistor and the gate electrode of said second access transistor.

12. The semiconductor device according to claim 9, wherein the channel region of the load transistor is two-dimensionally linear.

13. A semiconductor device, comprising:

a semiconductor substrate;

a gate electrode of a first access transistor and a gate electrode of a first driver transistor as well as a gate electrode of a second access transistor and a gate electrode of a second driver transistor formed at a prescribed distance away from each other on a main surface of said semiconductor substrate with a gate oxide film therebetween;

a first impurity region formed at the main surface of said semiconductor substrate to be sandwiched between the gate electrode of said first access transistor and the gate electrode of said first driver transistor;

a second impurity region formed at the main surface of said semiconductor substrate to be sandwiched between the gate electrode of said second access transistor and the gate electrode of said second driver transistor, without a gate electrode of a driver transistor between said second impurity region and said gate electrode of said second access transistor;

a first conductive layer electrically connected to said first impurity region and formed above the gate electrode of said first access transistor and the gate electrode of said first driver transistor with a first interlayer insulating film therebetween;

a gate electrode of a load transistor formed above said second impurity region with said first interlayer insulating film therebetween to extend above the gate electrode of said second access transistor and the gate electrode of said second driver transistor; and a second conductive layer formed above the gate electrode of said load transistor with a second interlayer insulating film therebetween, having a channel region of the load transistor formed across the gate electrode of said load transistor and a pair of impurity regions of the load transistor formed to sandwich the channel region, wherein the channel region of the load transistor and a first impurity region connected to one of the pair of source/drain regions are provided shifted from each other.

14. The semiconductor device according to claim 13, wherein the channel region of the load transistor is two-dimensionally linear.

* * * * *